(12) United States Patent
Lin et al.

(10) Patent No.: US 9,202,887 B2
(45) Date of Patent: *Dec. 1, 2015

(54) METHODS FOR FABRICATING IMPROVED BIPOLAR TRANSISTORS

(71) Applicants: Xin Lin, Phoenix, AZ (US); Daniel J. Blomberg, Chandler, AZ (US); Jiang-Kai Zuo, Chandler, AZ (US)

(72) Inventors: Xin Lin, Phoenix, AZ (US); Daniel J. Blomberg, Chandler, AZ (US); Jiang-Kai Zuo, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/466,042

(22) Filed: Aug. 22, 2014

(65) Prior Publication Data

US 2014/0363945 A1    Dec. 11, 2014

Related U.S. Application Data

(62) Division of application No. 13/590,411, filed on Aug. 21, 2012, now Pat. No. 8,847,358.

(51) Int. Cl.
| H01L 29/66 | (2006.01) |
| H01L 29/73 | (2006.01) |
| H01L 29/735 | (2006.01) |
| H01L 29/08 | (2006.01) |
| H01L 21/74 | (2006.01) |

(52) U.S. Cl.
CPC ............ *H01L 29/6625* (2013.01); *H01L 21/74* (2013.01); *H01L 29/0821* (2013.01); *H01L 29/66265* (2013.01); *H01L 29/735* (2013.01); *H01L 29/7317* (2013.01)

(58) Field of Classification Search
CPC ..................... H01L 29/6625; H01L 29/66265; H01L 29/735
See application file for complete search history.

*Primary Examiner* — Amar Movva
(74) *Attorney, Agent, or Firm* — Ingrassia Fisher & Lorenz, P.C.

(57) ABSTRACT

Bipolar transistors and methods for fabricating bipolar transistors are provided. In one embodiment, the method includes the step or process of providing a substrate having therein a semiconductor base region of a first conductivity type and first doping density proximate an upper substrate surface. A multilevel collector structure of a second opposite conductivity type is formed in the base region. The multilevel collector includes a first collector part extending to a collector contact, a second collector part Ohmically coupled to the first collector part underlying the upper substrate surface by a first depth, a third collector part laterally spaced apart from the second collector part and underlying the upper substrate surface by a second depth and having a first vertical thickness, and a fourth collector part Ohmically coupling the second and third collector parts and having a second vertical thickness different than the first vertical thickness.

20 Claims, 9 Drawing Sheets

METHODS FOR FABRICATING IMPROVED BIPOLAR TRANSISTORS

CROSS-REFERENCE TO RELATED APPLICATION

This application is a divisional of co-pending U.S. application Ser. No. 13/590,411, filed Aug. 21, 2012.

FIELD OF THE INVENTION

The present invention generally relates to semiconductor devices and circuits and methods for fabricating semiconductor devices and circuits and, more particularly, relates to semiconductor devices and circuits embodying bipolar transistors, as well as to methods for fabricating bipolar transistors.

BACKGROUND

Bipolar transistors are much used in modern electronics as individual devices and as part of various integrated circuits (ICs). It is often difficult to simultaneously achieve certain combinations of desired properties, as for example and not intended to be limiting, both high gain and high Early Voltage with adequate breakdown voltages. In the prior art it has been customary to tune the properties of particular devices by, for example, adjusting the doping profiles. However, in large scale production this may not be practical since manufacturing optimization and cost considerations often limit the variations in doping profiles that can be used in the manufacturing sequence for a particular semiconductor device or IC. Accordingly, a need continues to exist for improved bipolar transistors and methods for manufacturing the same, which permit both high gain and high Early Voltage to be simultaneously achieved using common manufacturing techniques.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
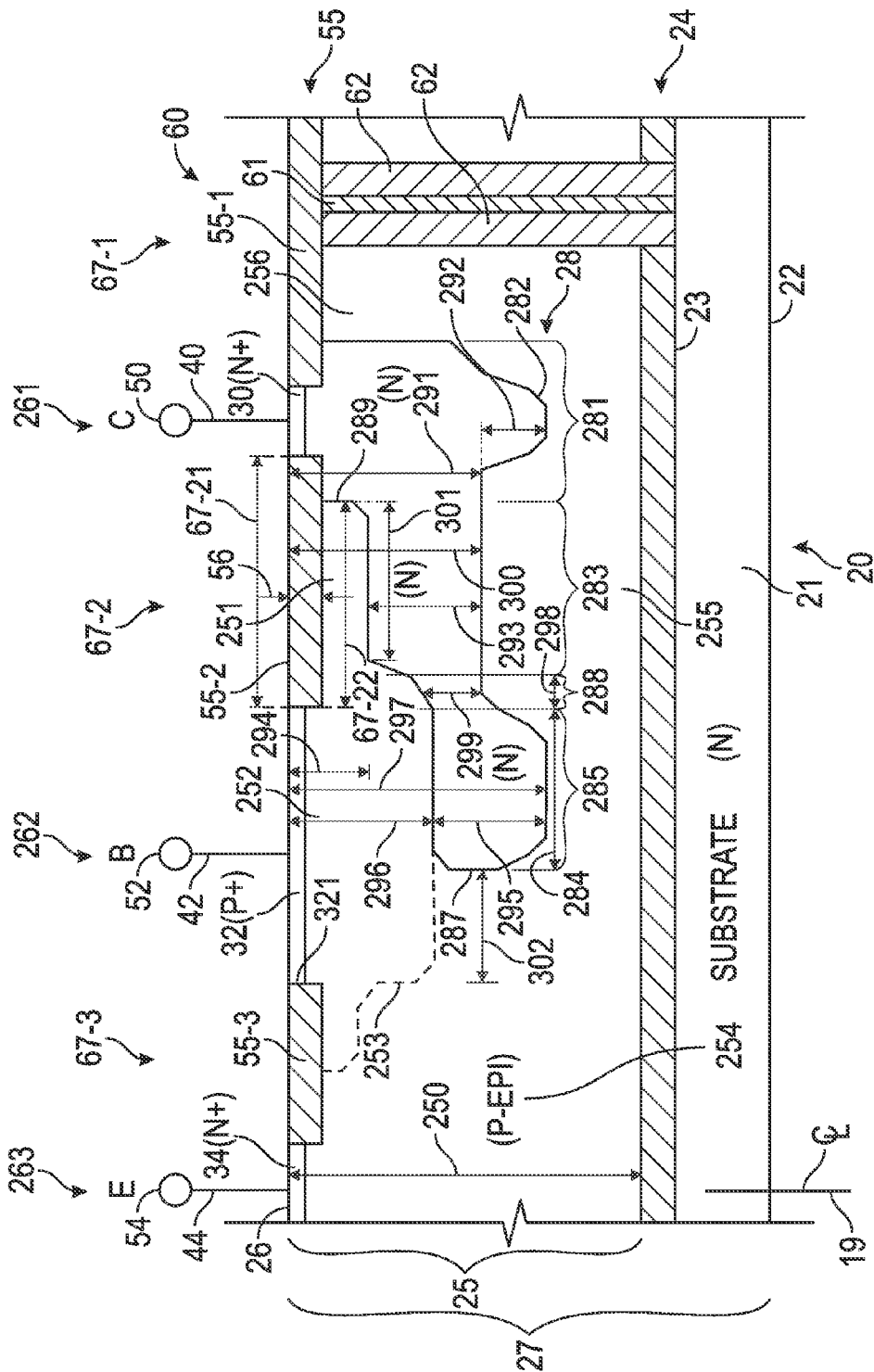
FIG. 1 shows a simplified cross-sectional view about a centerline of an improved bipolar transistor according to an embodiment of the present invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments of the invention described herein are, for example, capable of operation or arrangement in sequences other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" and the abbreviation "SC" are intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" and "SC substrate" are intended to include single crystal structures, polycrystalline structures, amorphous structures, thin film structures, layered structures as for example and not intended to be limiting, semiconductor-on-insulator (SOI) structures, insulator-on-semiconductor structures (IOS), and combinations thereof.

For convenience of explanation and not intended to be limiting, semiconductor devices and methods of fabrication are described herein for silicon semiconductors, but persons of skill in the art will understand that other semiconductor materials may also be used. Additionally, various device types and/or doped SC regions may be identified as being of N type or P type, but this is merely for convenience of description and not intended to be limiting, and such identification may be replaced by the more general description of being of a "first conductivity type" or a "second, opposite conductivity type" where the first type may be either N or P type and the second type is then either P or N type. Various embodiments of the invention will be illustrated for NPN bipolar transistors, but this is merely for convenience of description and is not intended to be limiting. Persons of skill in the art will understand that PNP transistors and other semiconductor devices and circuits embodying either or both NPN and PNP combinations may be provided by appropriate interchange of conductivity types in the various regions.

For convenience of description and not limitation, the custom is followed of identifying exemplary conductivity types of particular semiconductor regions, and the preferred formation technique where appropriate, by including such identification in the various figures in parentheses by way of example and not limitation. For example, for an NPN bipolar transistor, the emitter may be identified (N+), the base region as (P) or (P-EPI), and the collector region as (N) with an (N+) collector contact, etc. Persons of skill in the art will understand that this is merely by way of example and not limitation, and that other device types may be prepared by appropriate interchange of conductivity types, fabrication techniques and doping concentrations.

Adjusting doping profiles to suit particular device needs is a straightforward way to optimize device properties. However, adding or modifying process steps to provide a desired bipolar device characteristic generally adds cost and complexity. This is especially of concern for processes used to manufacture multiple device types at the same time on the same manufacturing line and/or substrate. Accordingly, a need exists for improved bipolar transistors and methods for manufacturing the same: (i) that are adapted to being "tuned" to suit particular applications, (ii) that accommodate a wide range of design space with little or no compromise of other properties, and (iii) that can be accomplished by layout adjustments without adding or significantly modifying process steps that would increase manufacturing cost. With the embodiments described below, bipolar device properties can be substantially modified just by layout adjustments. These embodiments can provide a wide design space without adding process cost. Thus, doping and masking steps can be shared with other devices on the wafer or chip without the bipolar transistors imposing undesirable constraints on process optimization.

Figure 2:
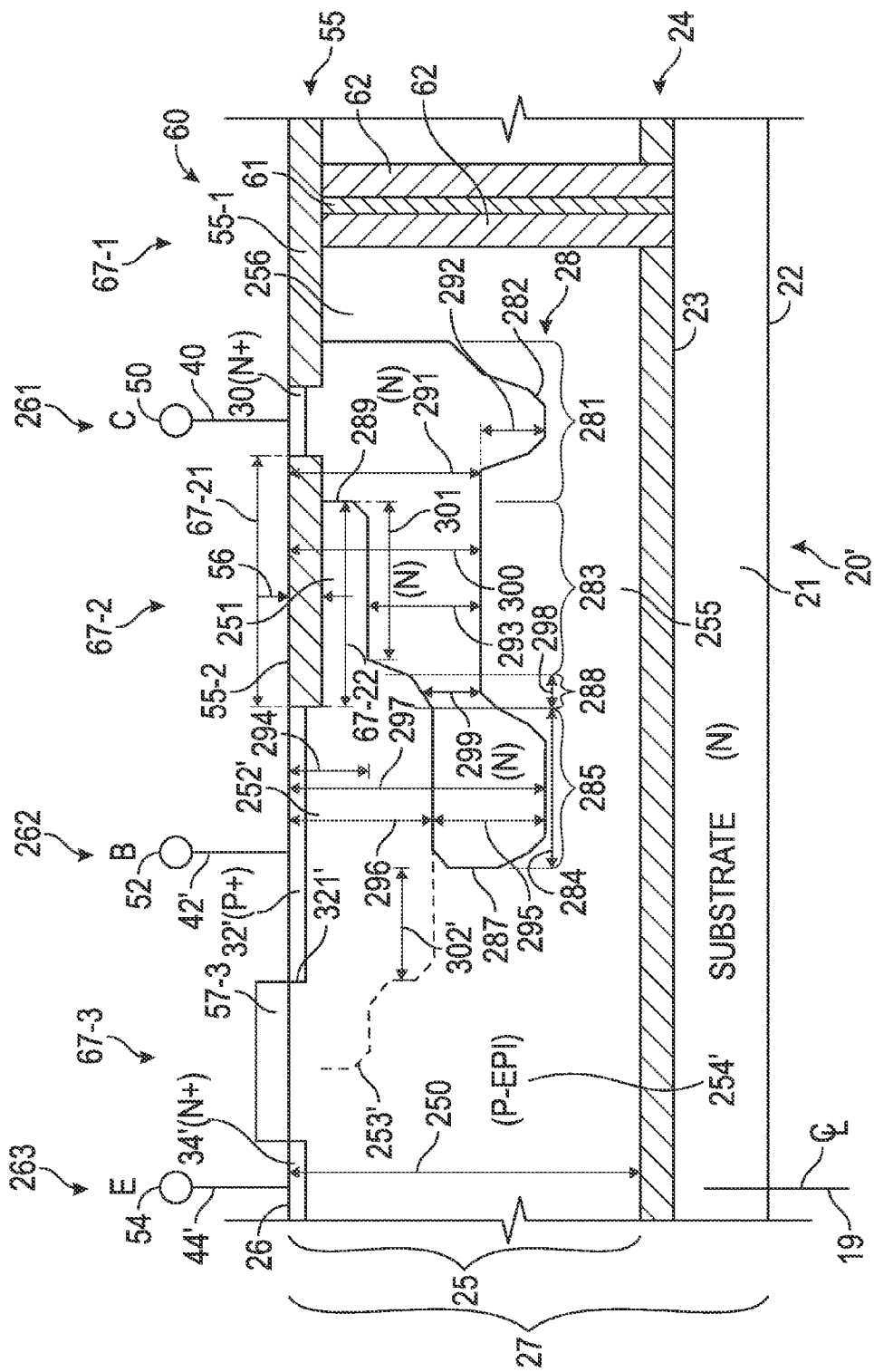
FIG. 2 shows a simplified cross-sectional view about a centerline of an improved bipolar transistor according to another embodiment of the present invention.

Referring now to FIGS. 1 and 2, it has been discovered that broadly tunable high gain, high Early Voltage, high breakdown voltage bipolar transistors (20, 20') can be provided by including a multi-level collector structure (28) combined with a lightly doped base region (25) in which the multilevel collector structure (28) is located. The multi-level collector structure (28) includes a relatively deep collector tip portion (285) underlying the base contact (32), a shallower central collector portion (283) coupled to the collector tip portion (285) by a self-aligned vertically narrower intermediate portion (288) and a further main collector portion (281) coupled to the central collector portion (283) and extending to the collector contact region (30). The lightly doped base region (25) contributes to high current gain. The depletable intermediate portion (288) allows the deeper collector tip portion (285) below the base contact (32) to be substantially pinned (e.g., approximately fixed) at an intermediate voltage so that it no longer closely follows the collector voltage at higher collector bias. This provides a high Early Voltage. The multi-level collector structure (28) may become fully depleted at still higher collector voltages, thereby preserving high breakdown voltages BVcbo and BVceo. BVcbo refers to the collector-base breakdown voltage with the emitter open and BVceo refers to the collector-emitter breakdown voltage with the base open. Such combination of properties is achieved using commonly available doping profiles consistent with manufacturing a wide variety of useful devices, by taking advantage of dopant channeling to form the multi-level collector region, and if desired, substantially in a single collector doping step. This is a highly desirable combination of properties.

FIG. 1 shows a simplified cross-sectional view about centerline 19 of improved bipolar transistor 20 according to an embodiment of the present invention. Referring now to FIG. 1, transistor 20 comprise substrate layer 21 having lower or bottom surface 22 and upper surface 23. Substrate layer 21 may be a semiconductor (SC) or dielectric substrate. In a preferred embodiment for NPN transistors, substrate layer 21 is an N type SC but may be of other conductivity type in other embodiments for either NPN or PNP transistors or may be an insulating substrate. In a preferred embodiment buried oxide (BOX) layer 24 overlies upper surface 23 of substrate layer 21. Above BOX layer 24 (when present) is semiconductor (SC) base region 25, preferably an epitaxial (EPI) layer extending to upper surface 26. For convenience of description and not intended to be limiting, region 25 may also be referred to as "EPI layer 25" or "EPI 25", but persons of skill in the art will understand that SC base region 25 formed by any means may also be used and the designation "EPI" as used herein for region 25 is intended to include other means of formation. Reference number 27 in FIGS. 1-9 is intended to refer to the combination of substrate layer 21 and base region 25, with or without BOX layer 24. For convenience of description the terms "substrate 27" and "substrate (27)" are used when referring to this combination.

Referring again to FIG. 1, lying within (e.g., P:-EPI) base region 25 at upper surface 26 are shallow trench isolation (STI) regions 55-1, 55-2, 55-3 (collectively 55) of thickness 56 and deep trench isolation (DTI) region 60. DTI region 60 is conventional and extends substantially from BOX layer 24 (when present) to upper surface 26, desirably but not essentially intersecting STI region 55-1. In a conventional form, DTI region 60 comprises polycrystalline semiconductor core 61 laterally surrounded by dielectric layer (e.g., silicon oxide) 62, but other laterally isolating structures may also be used. Reference number 261 identifies the location of collector contact region 30 between STI regions 55-1 and 55-2. Reference number 262 identifies the location of base contact region 32 between STI regions 55-2 and 55-3. Reference number 263 identifies the location of emitter region 34 to the left of STI region 55-3.

Also lying within base region 25 is (e.g., N type) multilevel collector structure 28. For convenience, brackets 281, 283, 284 and 288 are used to identify the various parts of multilevel collector structure 28, as follows: (a) "main" or "first" collector portion 281, (b) "central" or "second" collector portion 283, (c) "tip" or "third" collector portion 285, and (d) "intermediate" or "fourth" collector portion 288, where the alternative labels are intended interchangeably. Deeper collector portion 282 extends below main or first collector portion 281. Main or first collector portion 281 of (e.g., N type) collector structure 28 extends to upper surface 26, and is coupled to (e.g., N+) collector contact region 30 in location 261 between STI regions 55-1 and 55-2. Main or first collector portion 281 has depth 291 from upper surface 26. Deeper collector portion 282 of (e.g., N type) collector structure 28 lies below main or first collector portion 281 and extends to further depth 292 in (e.g., P-EPI) base region 25 below main or first collector portion 281. Deeper collector portion 282 is an artifact of a preferred process used to provide multi-level collector structure 28 and may be omitted in other embodiments.

Central or second collector portion 283 (e.g., N type) of vertical thickness 293 and depth 294 below upper surface 26 is coupled, for example, to the left side, of main or first collector portion 281. Base region portion 251 of (e.g., P-EPI) base region 25 lies between central or second collector portion 283 and STI region 55-2. Collector tip or third portion 285 (e.g., N type) of vertical thickness 295 lies to the left of and slightly spaced from (e.g., N type) central or second collector portion 283. Collector tip or third portion 285 lies at depth 296 below substrate upper surface 26, its lower surface lies at depth 297 below substrate upper surface 26. Depth 296 is preferably greater than or equal to depth 294 but other depths may also be used in other embodiments. Base region portion 252 (e.g., P type) lies between collector tip or third portion 285 of collector structure 28 and substrate upper surface 26, and has therein (e.g., P+) base contact 32 lying laterally between STI regions 55-2 and 55-3. Leftward edge 287 of collector tip or third portion 285 is laterally spaced distance 302 from leftward edge 253 of base region portion 252 underlying base contact region 32 and by about the same lateral distance 302 from leftward edge 321 of base contact 32, taking into account any lateral diffusion that may have occurred in connection with base region portion 252. Lateral distance 302 is desirably greater than zero but other distances may be used in other embodiments.

Connecting central or second collector portion 283 to deeper collector tip or third portion 285 is (e.g., N type) a desirably (vertically) narrower intermediate or fourth collector portion 288. Intermediate or fourth collector portion 288 has lateral width 298 and vertical thickness 299. Vertical thickness 299 of intermediate or fourth collector region 288 is different than and desirably less than vertical thickness 295 of collector tip or third portion 285, more usefully in the range of 1% to 90% of thickness 295 and preferably in the range of about 15% to 80% of vertical thickness 295. Lateral width 298 of intermediate or fourth portion 288 is generally different than and desirably less than the lateral width 284 of collector tip or third portion 285, but other arrangements can be used in other embodiments. The relatively thinner and/or narrower intermediate or fourth collector portion 288 of multilevel collector structure 28 becomes depleted as collector bias increases, thereby electrically separating the voltage on main or first collector portion 281 and tip or third collector portion 285. This provides high Early Voltages. Intermediate or fourth collector portion 288 desirably has lateral width 298 substantially of at least about 0.01 micrometers, and vertical thickness 299 of substantially about 0.01 micrometers or more, but larger and smaller widths and thicknesses can also be used in other embodiments. The potential of collector tip or third portion 285 is pinned after intermediate or fourth collector portion 288 is fully depleted. Once such depletion takes place, the collector current becomes nearly independent of the collector voltage, giving rise to a high Early Voltage. Vertical thickness 299 of intermediate or fourth collector portion 288 affects the collector voltage required to fully deplete the intermediate collector portion 288, but does not significantly change the Early Voltage as long as full depletion has occurred. For convenience of description, elements 281, 283, 285 and/or 288 of multilevel collector structure 28 may be referred to equivalently as regions, portions or parts 281, 283, 285 and/or 288.

Emitter region 34 lies to the left of STI region 55-3 conveniently at substrate upper surface 26. In this embodiment, the lateral separation of emitter region 34 and base contact region 32 is determined substantially by the lateral width of STI region 55-3. Base region portions 254 and 256 of (e.g., P-EPI) base region 25 substantially laterally surround collector structure 28, base region portion 255 of base region 25 underlies collector structure 28, and base region portions 251, 252 of base region 25 overlie collector structure 28 except where main or first collector portion 281 extends to collector contact region 30. As is explained more fully in connection with FIGS. 3-9, the doping concentrations of base region portions 251, 252 are desirably somewhat higher than the doping of the remainder of base region 25, for example by a factor in the range of about 2 to $10^5$, but different doping ratios may be used in other embodiments.

Conventional semiconductor-metal alloy contact 40 with terminal 50 is provided to collector contact region 30. Conventional semiconductor-metal alloy contact 42 with terminal 52 is provided to base contact region 32. Conventional semiconductor-metal alloy contact 44 with terminal 54 is provided to emitter region 34. Bipolar transistor 20, described above, is able to simultaneously provide high gain, high breakdown voltage and high Early Voltage. This is an extremely desirable combination of properties.

FIG. 2 shows a simplified cross-sectional view about centerline 19 of improved bipolar transistor 20' according to another embodiment of the invention. Because of the close similarity of transistors 20 and 20', the custom is adopted of using the same reference numbers to identify analogous regions in each device. Accordingly, the discussion of the various regions with like reference numbers provided in connection with transistor 20 of FIG. 1 is incorporated herein by reference. Those regions that serve the same function but which may differ in some detail have a prime (') added to their reference numbers in FIG. 2 so that, if desired, they may be identified individually.

Transistor 20' of FIG. 2 differs from transistor 20 of FIG. 1 in that STI region 55-3 of FIG. 1 is omitted in FIG. 2, and the lateral separation between base contact location 262 and emitter location 263 is substantially determined by silicide blocking (SB) region 57-3 shown in FIG. 2. As used herein, the term "silicide blocking region" is not limited merely to materials that block the formation of silicon-metal alloys but is intended to refer to any material that can act as a mask limiting the formation of metal-SC alloy contact regions of any type to exposed SC regions (of any SC material), as for example, limiting metal-SC alloy contact formation to emitter region 34' and base contact region 32' while not forming above upper surface 26 therebetween. Silicon nitride is a non-limiting example of a suitable material for silicide blocking (SB) region 57-3 but other dielectric material may also be used. As will be subsequently explained, silicide blocking (SB) region 57-3 can also conveniently act as a doping mask defining the lateral extent of emitter region 34' and the leftward extent of base contact region 32', but other doping masks may be used in other embodiments. As a practical matter, only those regions of transistor 20' to the left of multi-level collector structure 28 may differ in detail from comparable regions of transistor 20. The performance advantages (e.g., described above) provided by transistor 20 of FIG. 1 are also provided by transistor 20' of FIG. 2.

It will be noted that STI region 55-3 of FIG. 1 and SB region 57-3 of FIG. 2 perform analogous functions, among other things, laterally separating emitter region 34, 34' from base contact region 32, 32', and providing a mask used in part to define the locations of emitter region 34, 34' and base contact region 32, 32'. For convenience of description, in FIG. 1 only STI regions 55-1, 55-2, 55-3 are illustrated as separating collector contact region 30 from DTI region 60, collector contact region 30 from base contact region 32, and base contact region 32 from emitter region 34. In other embodiments one or more of such STI regions may be replaced by equivalent SB regions 57-1, 57-2 (not shown) and 57-3. Accordingly, the term lateral dielectric (LD) region(s) 67-i is intended to refer to either of, for example, STI region(s) 55-i or SB region(s) 57-i, where i=1 and/or 2 and/or 3. For future reference, LD region 67-2 has lateral width 67-21.

Figure 3:
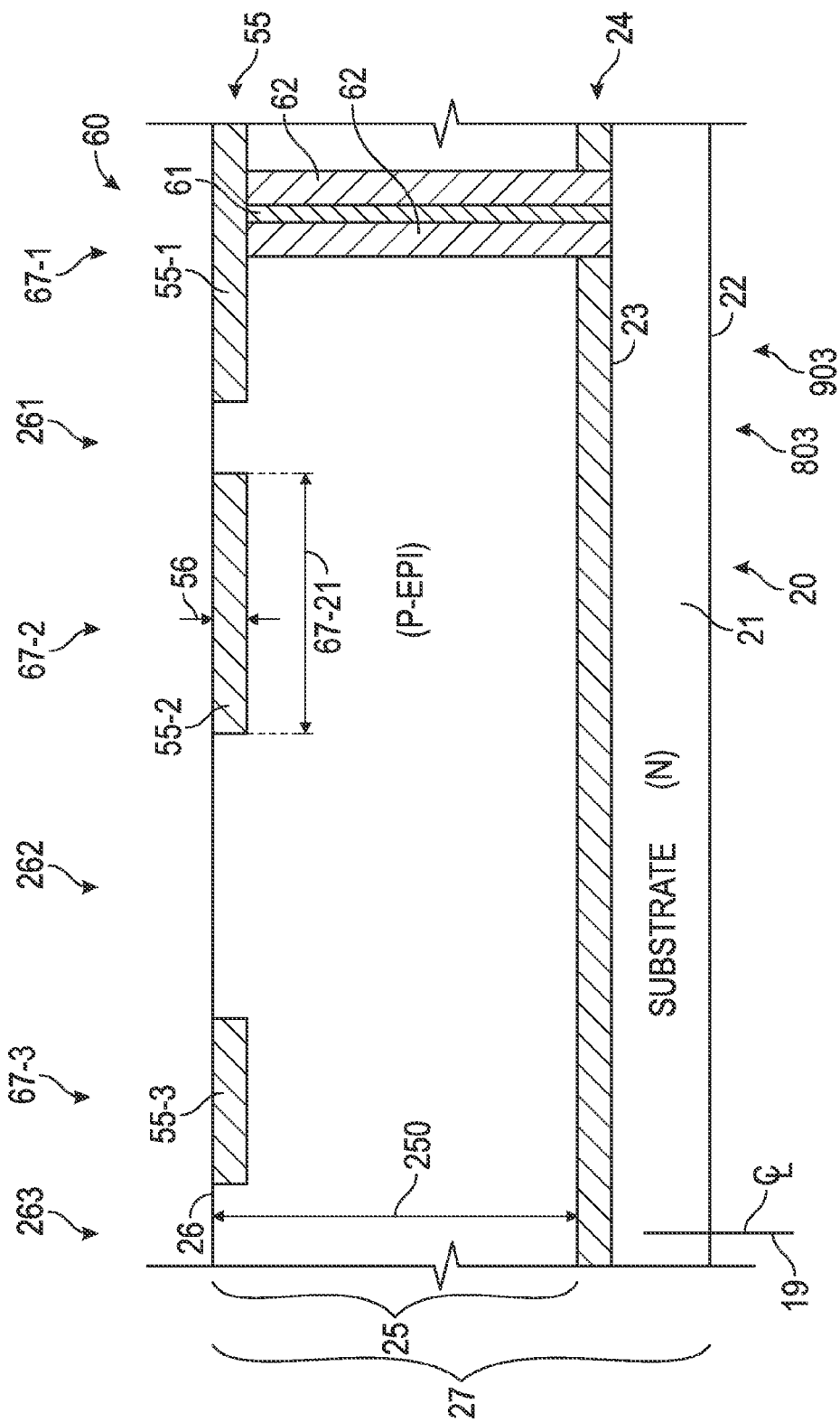
FIGS. 3-9 show simplified cross-sectional views of the bipolar transistors of FIGS. 1-2 during various stages of manufacture, according to further embodiments of the invention.
Figure 4:
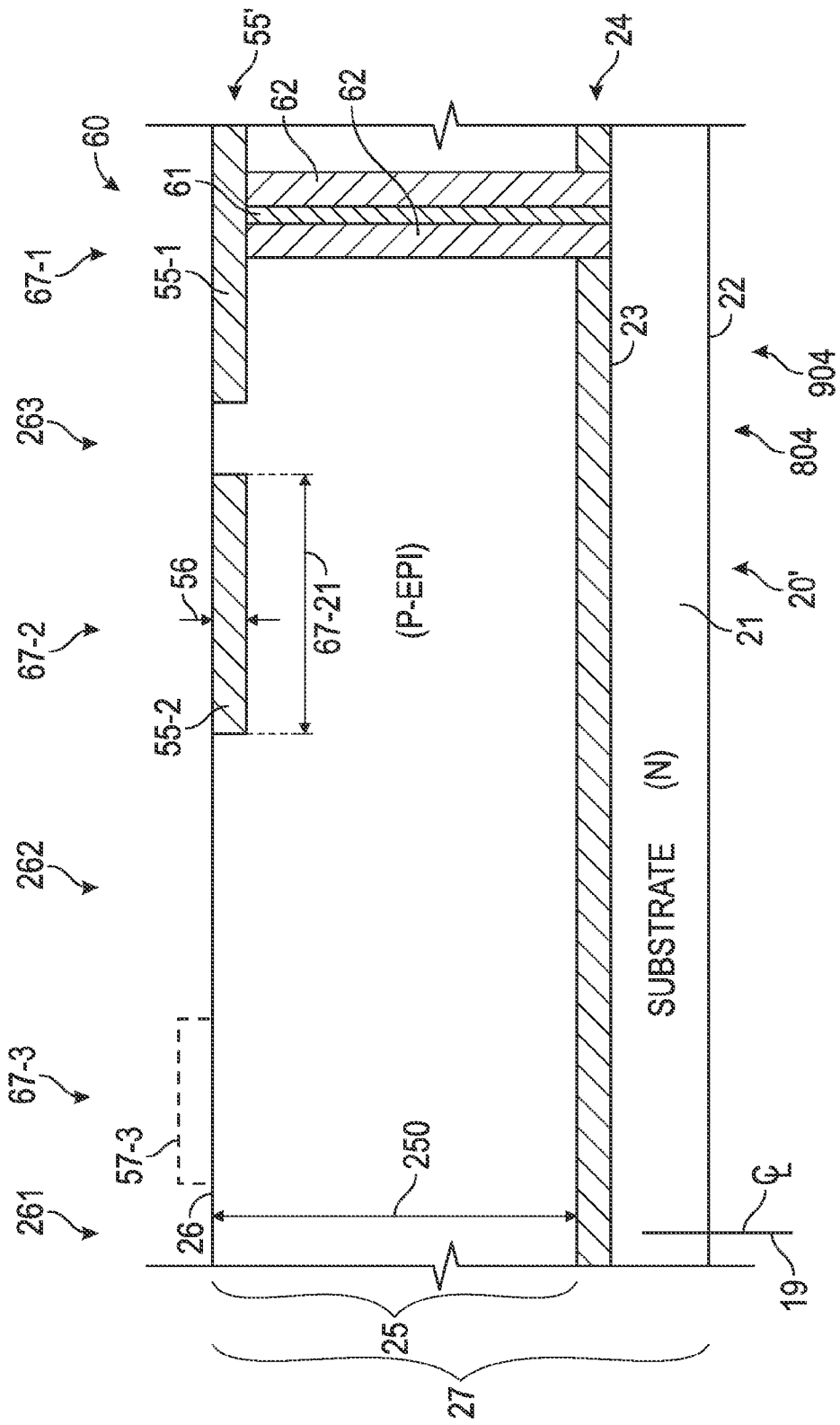

FIGS. 3-9 show simplified cross-sectional views of bipolar transistors 20, 20' of FIGS. 1-2 during various stages of manufacture 803-809 yielding structures 903-909, according to further embodiments of the invention. Referring now to FIGS. 3-4, in manufacturing stages 803, 804 substrate 27 is provided comprising (e.g. N type) substrate layer 21 with lower surface 22 and upper surface 23 and, in a preferred embodiment, with BOX layer or region 24 (e.g., of silicon oxide) overlying upper surface 23. BOX layer 24 may be omitted in yet other embodiments. Overlying the combination of substrate layer 21, and BOX layer 24 when present, is (e.g., P-EPI) SC base layer or region 25 of vertical thickness 250 and having upper surface 26. Base layer or region 25 conveniently has (e.g., P type) doping in the range of about 1E14 to 1E16 per $cm^3$, but higher or lower doping can also be used. Thickness 250 is usefully in the range of about 0.5 to 15 micrometers, but larger or smaller thicknesses may also be used. Conventional DTI region 60 having, for example, poly SC core 61 and surrounding dielectric (e.g., silicon oxide) layer 62, is provided extending, for example, from BOX layer 24 to upper surface 26, desirably intersecting LD region 67-1. Any form of DTI region 60 may be used. DTI region 60 is desirable to provide lateral isolation of transistor 20, 20' but may be omitted in other embodiments where such isolation is not needed.

In manufacturing stages 803 and 804, shallow trench isolation (STI) regions 55, 55' of thickness 56 are provided. STI regions 55, 55' are conveniently formed of silicon oxide, but other dielectric materials may also be used. Thickness 56 is usefully in the range of about 0.1 to 0.8 micrometers, but thicker and thinner STI regions may also be used, and STI regions 55-1, 55-2, 55-3 may have the same or different thicknesses. In manufacturing stage 803 of FIG. 3 for transistor 20, STI regions 55 comprise three STI regions 55-1, 55-2, 55-3, where: (a) the lateral separation between STI regions 55-1 and 55-2 defines collector contact location 261, (b) the lateral separation between STI regions 55-2 and 55-3 defines base contact location 262, and (c) and the leftward extent of STI region 55-3 defines emitter region location 263. Structure 903 results. In manufacturing stage 804 of FIG. 4 for transistor 20', STI regions 55' comprise STI regions 55-1 and 55-2. STI region 55-3 is omitted in manufacturing stage 804 of FIG. 4. Structure 904 results from manufacturing stage 804. Other than the absence of STI region 55-3, structure 904 of FIG. 4 is substantially similar to structure 903 of FIG. 3. Silicide blocking (SB) region 57-3 (to be applied later) which takes the place of STI region 55-3, is shown in dashed outline in FIG. 4.

FIGS. 5-9 show an illustrative sequence of doping steps, i.e., Implants A-E, but this sequence, while preferred, is not intended to be limiting, and such doping steps may be carried out in other sequences in other embodiments. For example, Implants A-E may be made in other orders in other embodiments, and such other sequences or orders are intended to be included in the claims that follow. Substantially the same manufacturing stages 805-809 of FIGS. 5-9 are used whether structure 903 or 904 is the starting point. In manufacturing stages 805-809 of FIGS. 5-9 it is assumed, except where specifically noted, that structure 903 is being used, resulting in device 20 of FIG. 1. Where a particular manufacturing stage would result in slightly different doped regions using structure 904, this is noted. But, in general, as far as the formation of multi-level collector structure 28 of transistors 20, 20' is concerned; structures 903 or 904 pass through substantially similar manufacturing stages 805-809 and result in transistors 20, 20' respectively.

Figure 5:
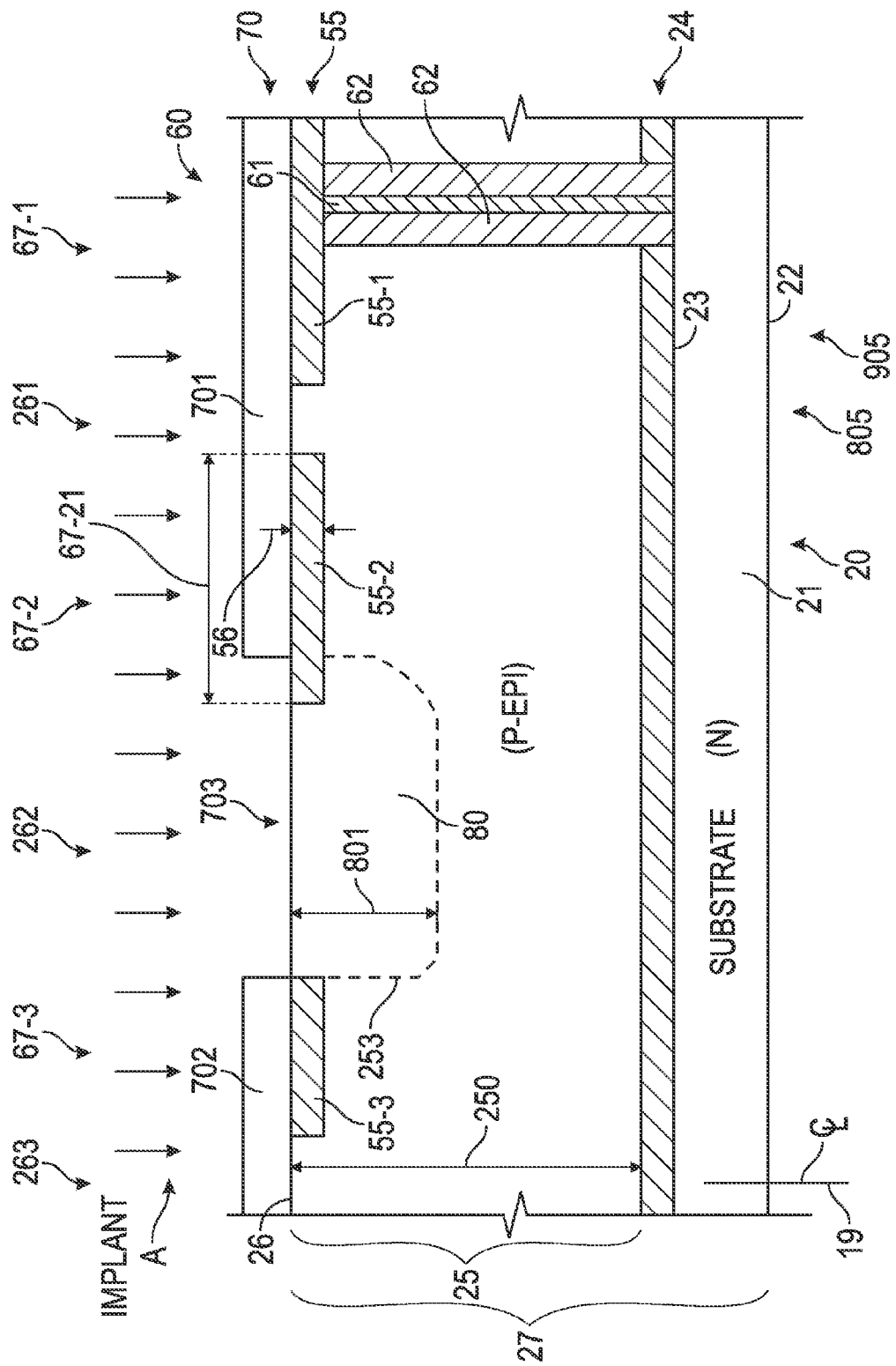

Referring now to manufacturing stage 805 of FIG. 5, structure 903 (or 904) has mask 70 applied to upper surface 26, where mask 70 has closed portions 701, 702 and open portion 703. Photo-resist is a non-limiting example of a suitable material for mask 70 and the further masks subsequently described. Open portion 703 conveniently encompasses base contact location 262. Implant A of, for example, a P type impurity, is provided through opening 703 to form (e.g., P type) doped region 80. Doped region 80 conveniently has a peak doping concentration in the range of about 1E17 to 5E18 per $cm^3$ and depth 801 in the range of about 1.5 to 2.5 micrometers from upper surface 26. Depth 801 is somewhat larger in base contact location 262 and somewhat shallower where Implant A passes through a portion of STI region 55-2. Structure 905 results, whether starting from structure 903 or 904.

Figure 6:
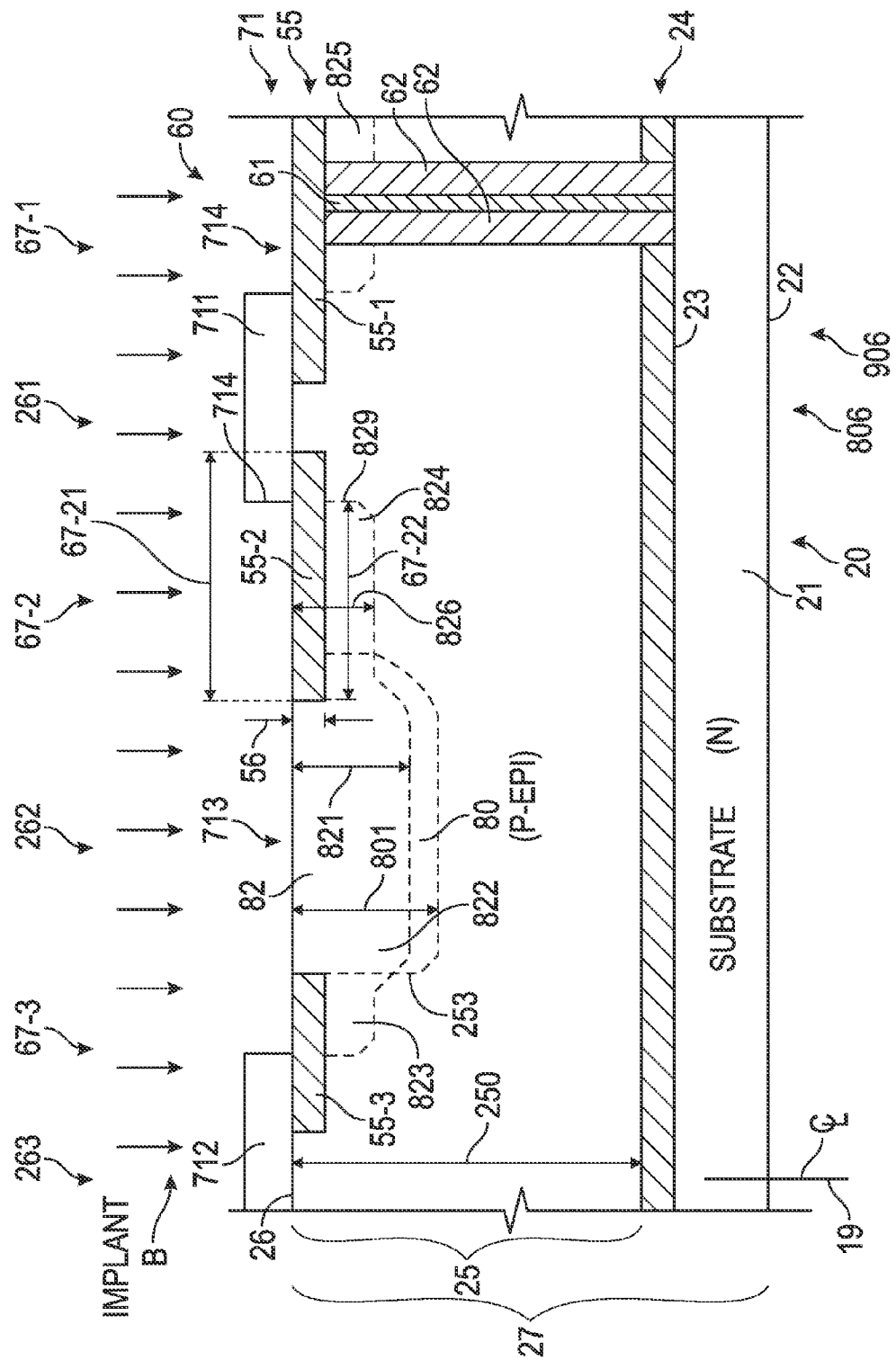

Referring now to manufacturing stage 806 of FIG. 6, mask 70 is removed and replaced with mask 71 having closed portions 711, 712 and open portions 713, 714. Closed portion 711 encompasses collector contact location 261 and closed portion 712 encompasses emitter region location 263. Open portion 713 extends over parts of LD regions 67-2 (e.g., STI region 55-2) and, in the case of structure 903, also over part of LD region 67-3 (e.g., STI region 55-3). In the case of structure 904, the left edge of mask opening region 713 can be approximately in the same lateral location with respect to base contact location 262 as for structure 903, but other locations may be used in other embodiments.

Implant B of, for example, a P type impurity, is provided through opening 713 to form (e.g., P type) doped region 82. Doped region 82 conveniently has a peak doping concentration in the range of about 1E16 to 5E17 per $cm^3$, preferably about an order of magnitude less than the peak doping concentration of Implant A of doped region 80. Doped region 82 has depth 821 in the range of about 1.0 to 2.0 micrometers from upper surface 26, being somewhat larger in base contact location 262 (e.g., of depth 821) and somewhat shallower in rightward portion 824 (e.g., of depth 826) where Implant B passes through a portion of LD region 67-2 (e.g., STI region 55-2), and similarly in leftward portion 823 where it passes through LD region 67-3 (e.g., STI region 55-3) of structure 903. Structure 906 results from manufacturing stage 806, whether starting from structure 903 or 904, but with some difference in the shape of doped region 82 on the left side of base contact location 262 because of the absence of STI region 55-3 in structure 904. For example, there may be slightly deeper dopant penetration in portion 823 for structure 904. Rightward portion 824 of depth 826 of doped region 82 resulting from Implant B extends laterally by distance 67-22 toward collector contact location 261 to boundary 829. Distance 67-22 is desirably less than lateral width 67-21 of LD region 67-2 but other distances may be used in other embodiments.

Figure 7:
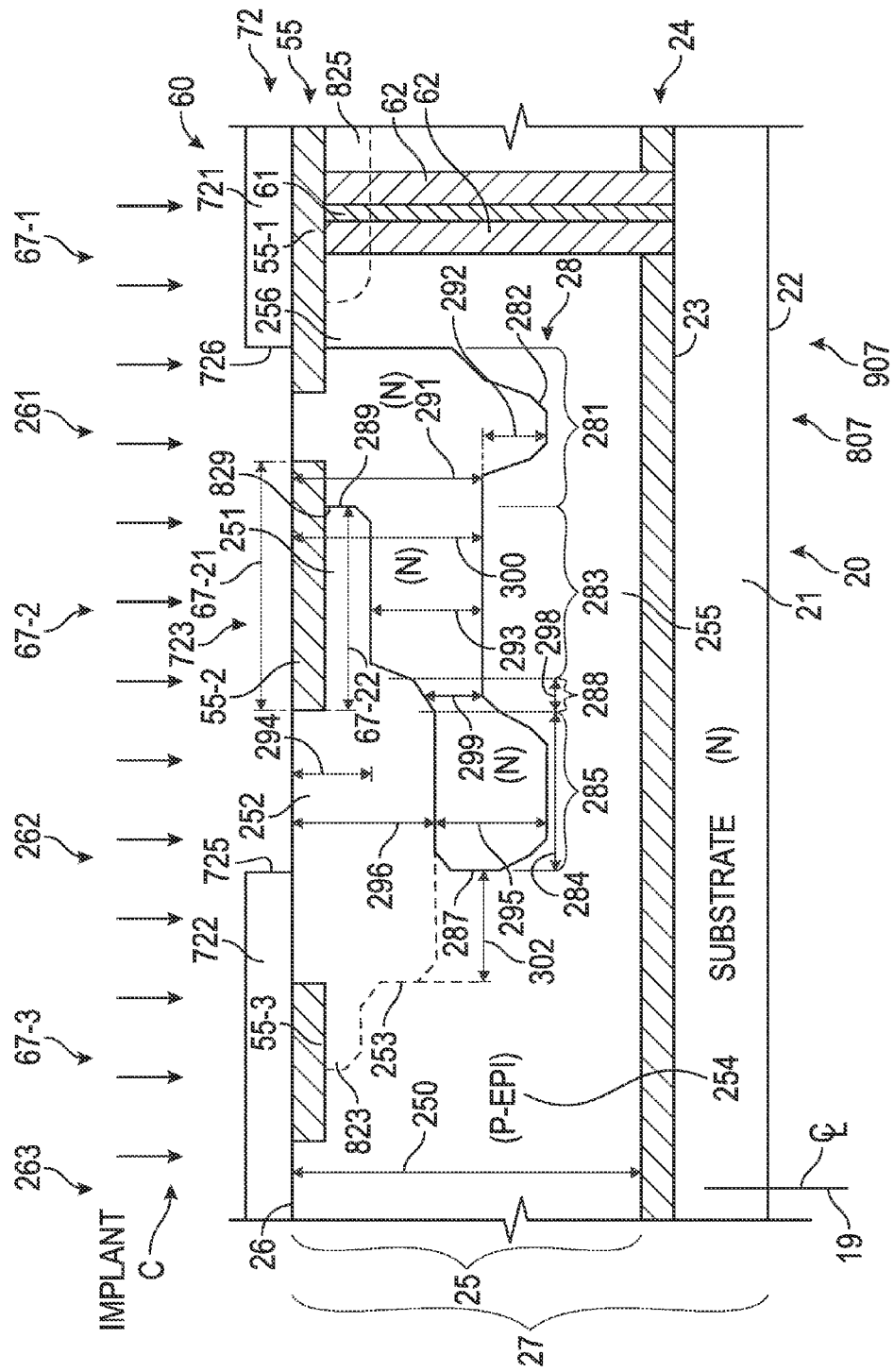

Referring now to manufacturing stage 807 of FIG. 7, mask 71 is removed and replaced with mask 72 having closed portions 721, 722 and open portion 723. Open portion 723 substantially determines the location and lateral extent of multi-layer collector structure 28. Rightward edge 725 of closed mask portion 722 determines leftward extent 287 of collector tip or third portion 285. Leftward edge 726 of closed mask portion 721 determines the rightward extent of main or first collector portion 281. Rightward edge 829 of doped region 824 substantially determines leftward extent 289 of main or first collector portion 281 proximate upper surface 26 and the rightward extent 67-22 of base region portion 251 of FIGS. 1-2. It will be apparent to those of skill in the art, that various base region portions 251, 252, etc., of FIGS. 1-2 are formed by various combinations of Implants A, B and C. For example, base region portion 824 of FIG. 6 underlying STI region 55-2 is formed by Implant B, while base region portion 251 of FIGS. 1-2 and 7-9 which occupies a substantially similar space underlying STI region 55-2 is formed by the combination of Implants B and C. Analogously, base region portions 80, 82 of FIG. 6 underlying base contact region location 262 are formed by the combination of Implants A and B, while base region portion 252 of FIGS. 1-2 and 7-9 occupying a substantially similar space underlying base contact location 262, is formed by the combination of Implants A, B (and C).

Implant C (e.g., N type) is desirably provided into SC base layer or region 25 through opening 723 of mask 72. In a preferred embodiment, (e.g., N type) multi-level collector structure 28 is substantially provided in a single (e.g., N type) doping operation, albeit taking into account the prior (e.g., P type) doping operations used to form doped regions 82, 80, 824, etc. However, in other embodiments, multiple (e.g., N type) doping steps may be used in forming multi-level collector region 28. For convenience of description and relating to other figures, after Implant C, what was referred to in FIG. 6 as portion 824 of doped region 82 formed by Implant B underlying STI region 55-2 is referred to hereafter and in FIGS. 1-2 as base region portion 251. Similarly, after Implant C, the combination of doped regions 80 and 82 of FIG. 6 underlying base contact location 262 is referred to hereafter and in FIGS. 1-2 as base region portion 252. It is desirable to use multiple doping steps to form base region portions 251 and 252 so that they can have somewhat different doping, but other arrangements may also be used. This facilitates providing transistors 20, 20' having high breakdown voltages. Stated another way, it is desirable that base region portion 252 has a higher doping concentration than base region portion 251, preferably by at least a factor of about 5 higher, but other dopant ratios may also be used.

Because of the different (e.g., P type) background doping densities in the different regions and the channeling effects or lack thereof due to the presence or absence of STI regions 55-1, 55-2, different collector depth profiles are obtained in the different portions of collector structure 28 even though provided using a single (e.g., N type) collector doping step. For example, in first or main collector portion 281, which is substantially unaffected by manufacturing stages 805, 806, the background doping is that provided by (e.g., P-EPI) base region 25. Accordingly, first or main collector portion 281, where it underlies STI regions 55-1, 55-2, has peak dopant concentration usefully in the range of about 1E16 to 1E17 per cm$^3$ and extends substantially to depth 291 from surface 26 of about 1.5 to 3.5 micrometers. Deeper part 282 of first or main collector portion 281 substantially underlies collector contact location 261 where there is no STI region. Hence, part 282 extends further distance 292 of about 0.5 to 2.0 micrometers into (e.g., P-EPI) base region 25.

Different channeling effects through doped regions 251, 252 and through partially overlying LD region 67-2 (e.g., STI region 55-2) lead to different depths and different peak dopant concentrations for different parts of multilevel collector region 28 being formed by Implant C. For example, second or central collector portion 283 forms underlying LD region 67-2 (e.g., STI region 55-2). Second or central collector portion 283 has vertical thickness 293 of about 0.5 to 3.5 micrometers, depth 294 below upper surface 26 of about 0.5 to 2.5 micrometers and peak dopant concentration usefully in the range of about 1E16 to 1E17 per cm$^3$. The lower extent of second or central portion 283 is at depth 300 below upper surface 26. Third or tip collector portion 285 has vertical thickness 295 of about 0.25 to 2.5 micrometers, and is formed underneath contact region 262 where no LD region is present. Its upper boundary is about at depth 296 below upper surface 26 of about 1.0 to 3.0 micrometers and it has a peak dopant concentration usefully in the range of about 5E15 to 1E17 per cm$^3$. Stated another way, implanting third or tip collector portion 285 beneath base contact location 262 through doped region 252 and not through overlying LD region 67-2 (e.g., STI region 55-2) insures that third or tip collector portion 285 will be deeper than second or central collector portion 283.

Fourth or intermediate collector portion 288, of lateral width 298 and substantially vertical extent 299, is formed automatically at the transition between second or central collector portion 283 and third or tip collector portion 285, where the (e.g., P type) background doping is transitioning between that provided in region or portion 824 by Implant B to that provided in region or portion 82, 80 by the combination of Implants A and B. This provides a peak dopant concentration in fourth or intermediate collector region 288 usefully in the range of about 5E15 to 1E17 per cm$^3$, width 298 usefully in the range of about 0.01 to 1.0 micrometers and vertical extent 299 usefully in the range of about 0.1 to 3.0 micrometers, but higher and lower dopant concentrations and different depths and widths may also be used. Fourth or intermediate collector portion 288 is automatically self-aligned with the leftward edge of LD region 67-2 (e.g., with STI region 55-2) and with adjoining collector portions 283 and 285. Further, as already noted, vertical thickness 299 of fourth or intermediate collector portion 288 will be less than vertical thickness 295 of third or tip collector portion 285, so that fourth or intermediate collector portion 288 is more easily depleted than adjacent collector portions 285, 283 as the collector voltage rises. Manufacturing stage 807 is not affected by the presence or absence of LD region 67-3 (e.g., STI region 55-3) since that location is covered and protected by closed portion 722 of mask 72. Structure 907 substantially results using either of structures 903 (STI region 55-3 is present) or 904 (STI region 55-3 is absent).

Figure 8:
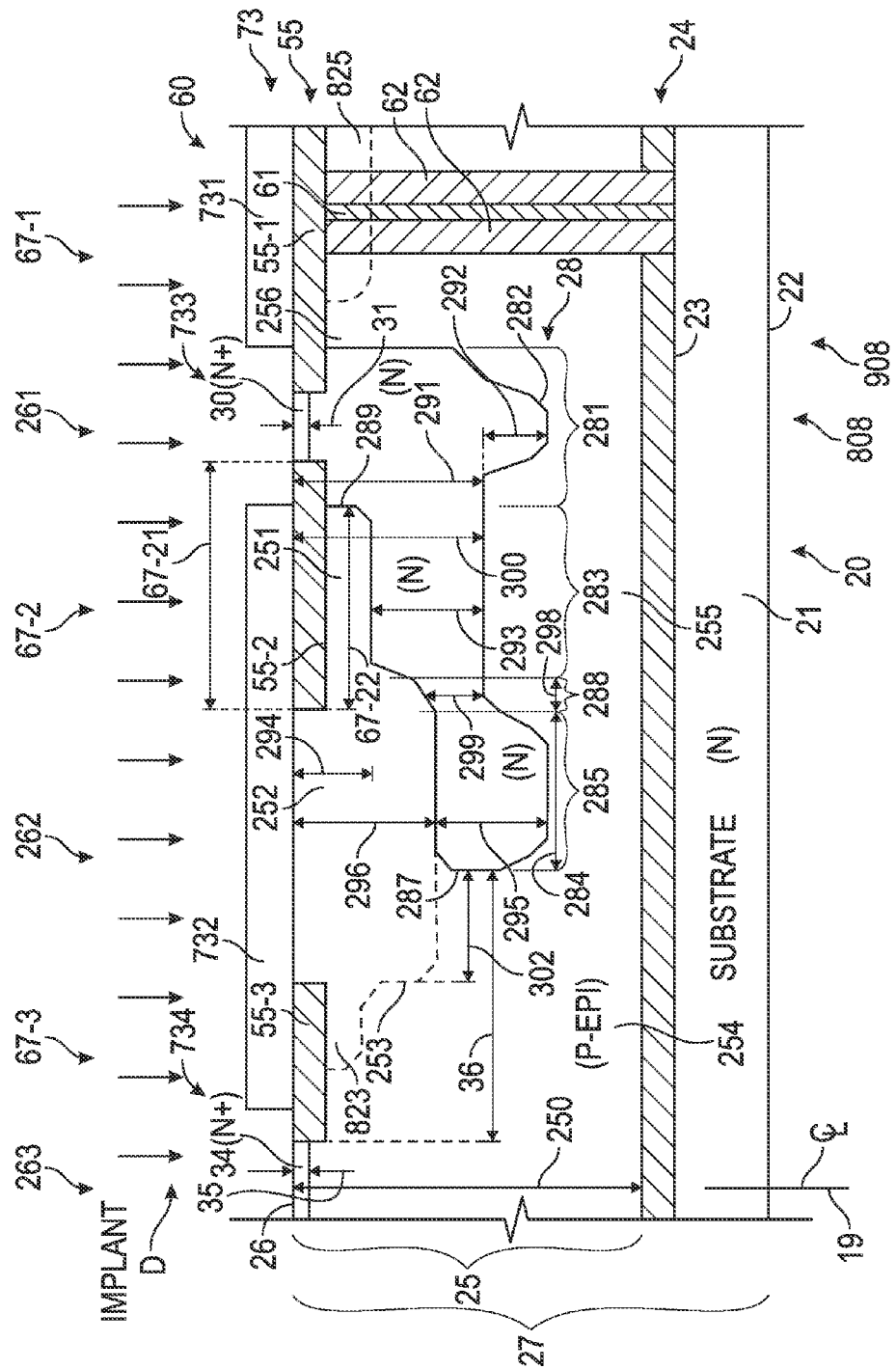

Referring now to manufacturing stage 808 of FIG. 8, mask 72 is removed and replaced with mask 73 having closed portions 731, 732 and open portions 733, 734. Open portions 733, 734 correspond to location 261 of collector contact region 30 and location 263 of emitter region 34. Implant D (e.g., N+) is provided into SC base region 25 through openings 733, 734 of mask 73 to form (e.g., N+) collector contact region 30 of depth 31 and (e.g., N+) emitter region 34 of depth 35. Depths 31, 35 may be the same or different. FIG. 8 shows manufacturing stage 808 and structure 908 corresponding to structure 903 of device 20 including STI region 55-3. Persons of skill in the art will understand that for structure 904 (no STI region 55-3), silicide blocking region 57-3 (see FIGS. 2 and 4) is applied any time prior to manufacturing stage 808 and serves in place of STI region 55-3 of structure 903 to provide substantially the same result with respect to emitter region 34 for structure 904. An alternative process sequence using structure 904 is that Implant D is provided into SC emitter contact region 34', while silicide block layer 57-3 is formed afterwards within the defined region. Either method is useful. Structure 908 results, with STI region 55-3 present when employing structure 903 and preferably SB region 57-3 (e.g., see FIGS. 2 and 4) present when employing structure 904.

Figure 9:
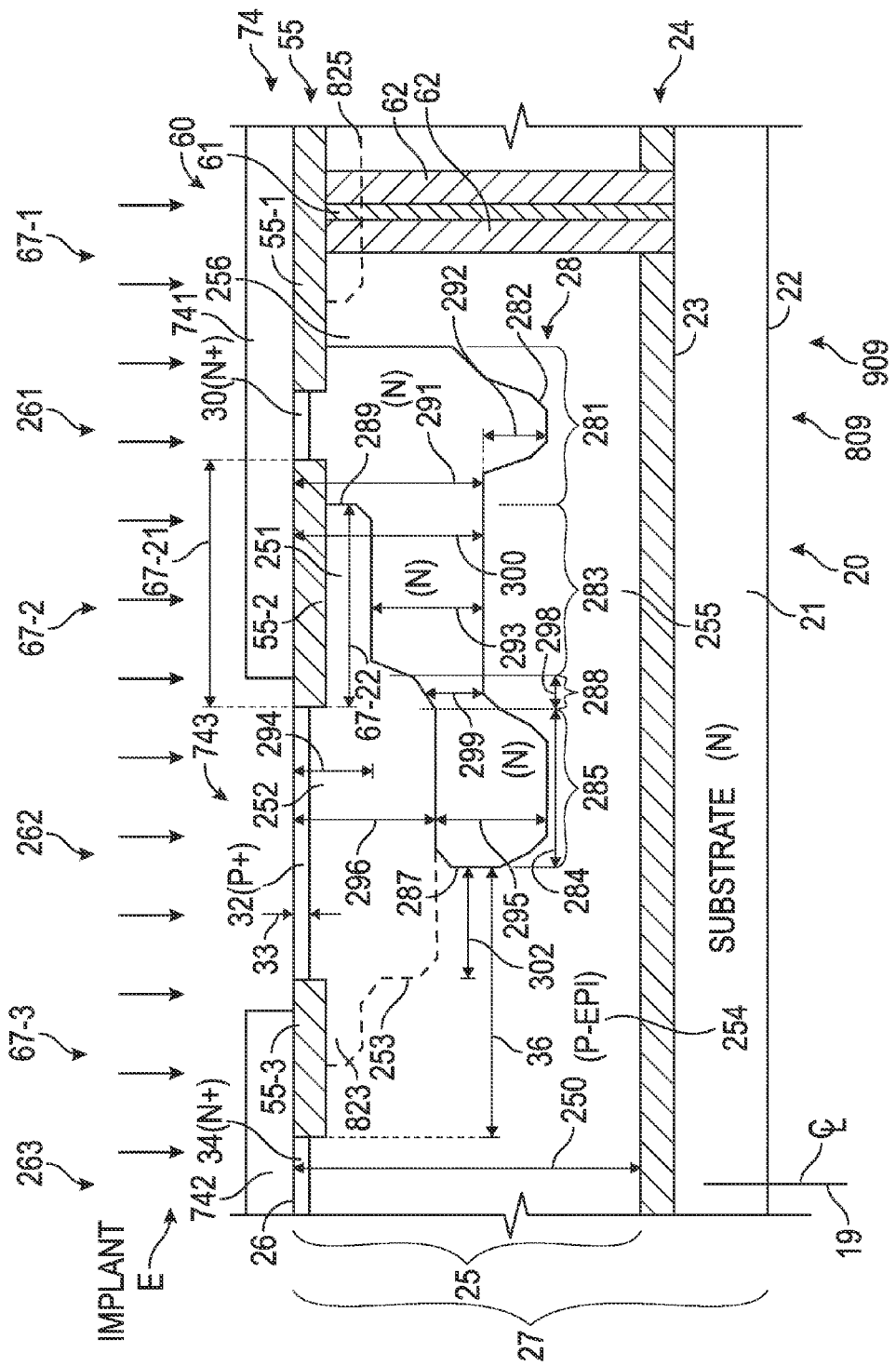

Referring now to manufacturing stage 809 of FIG. 9, mask 73 is removed and replaced with mask 74 having closed portions 741, 742 and open portion 743. Open portion 743 corresponds to location 262 of base contact 32. Implant E (e.g., P+) is provided into SC base layer through openings 743 of mask 74 to form (e.g., P+) base contact region 32 of depth 33. Structure 909 results. FIG. 9 shows manufacturing stage 809 with structure 909 corresponding to structure 903 of device 20 including STI region 55-3. Persons of skill in the art will understand that for structure 904 (no STI region 55-3), silicide blocking region 57-3 (see FIGS. 2 and 4) serves in place of STI region 55-3 to provide substantially the same result with respect to base contact region 32. For structure 904, Implant E could be provided into SC base contact region 32 prior to formation of silicide block layer. Afterwards, silicide block layer 57-3 is formed within the defined region.

Either method is useful. Structure 909 results, with those variations discussed above depending upon whether structure 903 or 904 is used.

As noted earlier, for convenience of explanation, the illustrated sequence of operations has Implants A and B made prior to Implant C, and Implants D and E made after Implant C. However, in other embodiments, Implants A-E may be made in other orders and the method described above and the claims that follow are not intended to be limited just to the illustrated sequence.

According to a first embodiment, there is provided a bipolar transistor (20, 20'), comprising, a substrate (27) having a semiconductor base region (25) of a first conductivity type at least in part proximate an upper substrate surface (26), and a multi-level collector structure (28) of a second, opposite, conductivity type located in the semiconductor base region (25), wherein the multi-level collector structure comprises a central collector portion (283) of a first vertical extent (293) underlying a first part (251) of the base region (25), a collector tip portion (285) of a second vertical extent (295) underlying another part (252) of the base region (25) and separated from the central collector portion (283) by an intermediate collector portion (288) of a third vertical extent (299) different than the second vertical extent (295). According to a further embodiment, the third vertical extent (299) is in a range of about 1% to 90% of the second vertical extent (295). According to a still further embodiment, the third vertical extent (299) is in a range of about 15% to 80% of the second vertical extent (295). According to a yet further embodiment, the multilevel collector structure (28) is substantially surrounded on all sides by parts (251, 252, 254, 255, 256) of the base region (25) except where the collector structure (28) extends to a collector contact region (30). According to a still yet further embodiment, the central collector portion (283) lies at a first depth (294) beneath the upper surface (26) and the collector tip portion (285) lies at a second depth (296) beneath the upper substrate surface (26) different from the first depth (294). According to a yet still further embodiment, the collector tip second lateral width (298) different than the first lateral width (284). According to another embodiment, the transistor (20, 20') further comprises a base contact region (32) and wherein the collector tip portion (285) underlies at least a portion of the base contact region (32). According to still another embodiment, the transistor (20, 20') further comprises a shallow trench isolation region (55-2) proximate the upper surface (26) overlying the first part (251) of the base region (25). According to yet another embodiment, the transistor (20, 20') further comprises an emitter region (34) of the second conductivity type in the base region (25) laterally spaced apart from the collector tip portion (285), a base contact region (32) of the first conductivity type in the base region (25) at least in part overlying the collector tip portion (285) and a collector contact region (30) of the first conductivity type laterally spaced apart from the base contact region (32) and Ohmically coupled to the central collector portion (283). According to still yet another embodiment, the first part (251) of the base region (25) extends laterally from the base contact region (32) toward the collector contact region (30).

According to a second embodiment, there is provided a method for forming a bipolar transistor (20, 20') comprising, providing a substrate (27) having therein a semiconductor base region (25) of a first conductivity type and first doping density proximate an upper substrate surface (26), and forming in the base region (25) a multilevel collector structure (28) of a second opposite conductivity type and having a first collector part (281) extending to a collector contact (30), a second collector part (283) Ohmically coupled to the first collector part (281) underlying the upper substrate surface (26) by a first depth (294), a third collector part (285) laterally spaced apart from the second collector part (283) and underlying the upper substrate surface (26) by a second depth (296) and having a first vertical thickness (295), and a fourth collector part (288) Ohmically coupling the second (283) and third (285) collector parts and having a second vertical thickness (299) different than the first vertical thickness (295). According to a further embodiment, the step of forming in the base region (25) a multilevel collector structure (28) of a second opposite conductivity type occurs during a common second conductivity type doping procedure. According to a still further embodiment, the method further comprises prior to the step of forming the multilevel collector structure (28), forming a shallow trench isolation (STI) region (55-2) proximate the upper substrate surface (26) and substantially forming the second collector part (283) by implanting a dopant of the second conductivity type through the STI region (55-2). According to a yet further embodiment, the method comprises before or after forming the multilevel collector structure, adding impurities of the first conductivity type in regions (80, 82, 824) overlying regions occupied or to be subsequently occupied by the second (283), third (285) and fourth (288) collector parts. According to a still yet further embodiment, the method comprises forming proximate the upper substrate surface (26) a lateral dielectric (LD) region (67-3) laterally spaced apart from the second collector part (285), the LD region (67-3) substantially determining lateral separation of an emitter region (34) and a base contact region (32). According to a yet still further embodiment, the LD region (67-3) is a shallow trench isolation (STI) region (55-3). According to another embodiment, the LD region (67-3) is a metal-semiconductor alloy blocking region (57-3).

According to a third embodiment, there is provided a bipolar transistor (20, 20') having an upper surface (26), comprising, an emitter region (34), a base contact region (32) and a collector contact region (30) proximate the upper surface (26), a multilevel collector structure (28) comprising, a first part (281) of a first vertical extent (291) coupled to the collector contact region (30), an adjacent second part (283) having a second vertical extent (293), a third part (285) coupled to the second part (283) and of a depth (296), and a fourth part (288) having a fourth vertical extent (299) coupling the second part (283) and the third part (285), and a first base region portion (251) overlying the second part (283), a second base region portion (252) separating the third part (285) from the base contact region (32), and other base region portions (254, 256, 255) laterally surrounding and underlying the multilevel collector structure (28). According to a further embodiment, the bipolar transistor (20, 20') further comprises a first lateral dielectric (LD) region (67-2) laterally separating the collector contact region (30) and the base contact region (32) and a second LD region (67-3) laterally separating the base contact region (32) and the emitter region (34). According to a still further embodiment, the first LD region (67-2) is a shallow trench isolation (STI) region (55-2) and the second LD region (67-3) is a further STI region (55-3) or a silicide blocking (SB) region (57-3).

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a bipolar transistor, comprising:
    providing a substrate having therein a semiconductor base region of a first conductivity type and first doping density proximate an upper substrate surface; and
    forming in the base region a multilevel collector structure of a second opposite conductivity type and having a first collector part extending to a collector contact, a second collector part Ohmically coupled to the first collector part underlying the upper substrate surface by a first depth, a third collector part laterally spaced apart from the second collector part and underlying the upper substrate surface by a second depth and having a first vertical thickness, and a fourth collector part Ohmically coupling the second and third collector parts and having a second vertical thickness different than the first vertical thickness.

2. The method of claim 1, wherein the step of forming in the base region a multilevel collector structure of a second opposite conductivity type occurs during a common second conductivity type doping procedure.

3. The method of claim 1, further comprising, prior to the step of forming the multilevel collector structure, forming a shallow trench isolation (STI) region proximate the upper substrate surface and substantially forming the second collector part by implanting a dopant of the second conductivity type through the STI region.

4. The method of claim 1, further comprising, before or after forming the multilevel collector structure, adding impurities of the first conductivity type in regions overlying regions occupied or to be subsequently occupied by the second, third, and fourth collector parts.

5. The method of claim 1, further comprising forming proximate the upper substrate surface a lateral dielectric (LD) region laterally spaced apart from the second collector part, the LD region substantially determining lateral separation of an emitter region and a base contact region.

6. The method of claim 5, wherein the LD region is a shallow trench isolation region.

7. The method of claim 5, wherein the LD region is a metal-semiconductor alloy blocking region.

8. A method for fabricating a bipolar transistor, comprising:
    providing a substrate having a semiconductor base region of a first conductivity type at least in part proximate an upper substrate surface; and
    forming a multi-level collector structure of a second, opposite, conductivity type located in the semiconductor base region, the multi-level collector structure formed to include a central collector portion of a first vertical extent underlying a first part of the base region, a collector tip portion of a second vertical extent underlying another part of the base region and separated from the central collector portion by an intermediate collector portion of a third vertical extent different than the second vertical extent.

9. The method of claim 8, wherein forming comprises forming the multi-level collector structure such that the third vertical extent is in a range of about 1% to 90% of the second vertical extent.

10. The method of claim 9, wherein forming comprises forming the multi-level collector structure such that the third vertical extent is in a range of about 15% to 80% of the second vertical extent.

11. The method of claim 8, wherein forming comprises forming the multi-level collector structure to be substantially surrounded on all sides by parts of the base region except where the collector structure extends to a collector contact region.

12. The method of claim 8, wherein forming comprises forming the multi-level collector structure such that the central collector portion lies at a first depth beneath the upper surface and the collector tip portion lies at a second depth beneath the upper substrate surface different from the first depth.

13. The method of claim 8, wherein forming comprises forming the multi-level collector structure such that the collector tip portion has a first lateral width and the intermediate collector portion has a second lateral width different than the first lateral width.

14. The method of claim 8, further comprising forming a base contact region at least a portion of which overlies the collector tip portion.

15. The method of claim 8, further comprising forming a shallow trench isolation region proximate the upper surface overlying the first part of the base region.

16. The method of claim 8, further comprising:
    forming an emitter region of the second conductivity type in the base region laterally spaced apart from the collector tip portion;
    forming a base contact region of the first conductivity type in the base region at least in part overlying the collector tip portion; and
    forming a collector contact region of the first conductivity type laterally spaced apart from the base contact region and Ohmically coupled to the central collector portion.

17. The method of claim 16, wherein forming comprises forming the multi-level collector structure such that the first part of the base region extends laterally from the base contact region toward the collector contact region.

18. A method for fabricating a bipolar transistor, comprising:
    forming an emitter region, a base contact region and a collector contact region proximate an upper surface of the bipolar transistor;
    producing a multilevel collector structure comprising a first part of a first vertical extent coupled to the collector contact region, an adjacent second part having a second vertical extent, a third part coupled to the second part and of a depth, and a fourth part having a fourth vertical extent coupling the second part and the third part; and
    forming a first base region portion overlying the second part, a second base region portion separating the third part from the base contact region, and other base region portions laterally surrounding and underlying the multilevel collector structure.

19. The method of claim 18, further comprising:
    forming a first lateral dielectric (LD) region laterally separating the collector contact region and the base contact region; and
    forming a second LD region laterally separating the base contact region and the emitter region.

20. The method of claim 19, wherein forming the first LD region comprises forming the first LD region as a shallow trench isolation (STI) region, and wherein forming the second LD region comprises forming the second LD region as a further STI region or as a silicide blocking region.

* * * * *